US006965782B1

United States Patent
Nuovo et al.

(10) Patent No.: US 6,965,782 B1
(45) Date of Patent: Nov. 15, 2005

(54) NAVIGATION KEY FOR A HANDSET

(75) Inventors: Frank Nuovo, Los Angeles, CA (US); Morten Rolighed Christenen, Lyngby (DK); Sten Carlsen, Rodovre (DK); Christian Kraft, Copenhagen (DK)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/543,831

(22) Filed: Apr. 5, 2000

Related U.S. Application Data

(62) Division of application No. 08/923,686, filed on Sep. 4, 1997, now Pat. No. 6,097,964.

(51) Int. Cl.[7] .................................................. H04Q 7/32
(52) U.S. Cl. ...................... 455/550; 455/566; 379/433; 345/167; 345/168; 345/326
(58) Field of Search ................................ 455/550, 566; 379/433, 368, 434, 428, 142; 345/167, 168, 345/326

(56) References Cited

U.S. PATENT DOCUMENTS

| | | | | |
|---|---|---|---|---|
| 3,891,143 A | * | 6/1975 | Haeusler | 235/437 |
| 4,724,715 A | | 2/1988 | Culver | 74/471 |
| 4,739,128 A | * | 4/1988 | Grisham | 200/6 A |
| 5,266,949 A | | 11/1993 | Rossi | 341/22 |
| 5,396,264 A | | 3/1995 | Falcone et al. | 345/146 |
| 5,408,060 A | | 4/1995 | Muurinen | 200/314 |
| 5,436,954 A | * | 7/1995 | Nishiyama et al. | 455/566 |
| 5,477,508 A | | 12/1995 | Will | 368/189 |
| 5,692,032 A | | 11/1997 | Seppanen et al. | 379/59 |
| 5,794,142 A | | 8/1998 | Vanttila et al. | 455/419 |
| 5,805,084 A | | 9/1998 | Mannisto | 341/22 |
| 5,825,353 A | * | 10/1998 | Will | 345/184 |
| 5,841,849 A | * | 11/1998 | Macor | 379/142.17 |
| 5,845,205 A | | 12/1998 | Alanara et al. | 455/564 |
| 5,870,683 A | | 2/1999 | Wells et al. | 455/566 |
| 5,887,264 A | | 3/1999 | Kohler | 455/461 |
| 5,903,832 A | | 5/1999 | Seppanen et al. | 455/414 |
| 5,905,235 A | | 5/1999 | Charman | 200/5 A |
| 5,960,043 A | | 9/1999 | Lobo et al. | 375/316 |
| 5,983,081 A | | 11/1999 | Lehtinen | 455/76 |
| 5,995,846 A | | 11/1999 | Jakobsen | 455/517 |
| 6,006,114 A | | 12/1999 | Seppanen et al. | 455/567 |
| 6,032,038 A | | 2/2000 | Schroderus et al. | 455/405 |
| 6,397,084 B1 | * | 5/2002 | Wicks et al. | 455/566 |

FOREIGN PATENT DOCUMENTS

| | | |
|---|---|---|
| EP | 0463856 A2 | 1/1992 |
| EP | 0531829 A1 | 3/1993 |

(Continued)

OTHER PUBLICATIONS

United Kingdom Search Report issued on GB 9727060.7.

(Continued)

*Primary Examiner*—Nick Corsaro
*Assistant Examiner*—Alan T. Gantt
(74) *Attorney, Agent, or Firm*—Perman & Green, LLP.

(57) ABSTRACT

A telephone handset comprises a front surface with a display and a keypad. The keypad includes a group of keys for entering alphanumeric signs and a key for navigating a cursor in the display. The navigation key is placed in the front surface of the phone between the display and the group of alphanumeric keys, and it includes a roller body which extends partly though an opening in the front surface of the phone. The roller body is essentially cylindrical with a length and diameter of the same size as the width of the keys in said group of keys for entering alphanumeric signs.

18 Claims, 8 Drawing Sheets

FOREIGN PATENT DOCUMENTS

| | | |
|---|---|---|
| EP | 0 588 210 A1 | 3/1994 |
| EP | 0 669 715 A1 | 8/1995 |
| EP | 0679003 A2 | 10/1995 |
| EP | 0 715 441 A1 | 6/1996 |
| EP | 0 724 278 | 7/1996 |
| FR | 2721419 A3 | 12/1995 |
| GB | 2 260 598 A | 4/1993 |
| GB | 2260598 A | 4/1993 |
| GB | 2293951 | 10/1996 |
| GB | 2 318 945 A | 5/1998 |
| JP | 4-245837 | 9/1992 |
| JP | 4245837 | 9/1992 |
| JP | 5036532 | 5/1993 |
| JP | 8079366 | 3/1996 |
| WO | WO 97/09101 | 3/1997 |

OTHER PUBLICATIONS

United Kingdom Search Report issued on GB 9727058.1.
United Kingdom Search Report issued on GB 9727062.3.
Abstract JP 4245837 (English Translation).
Abstract JP 8079366 (English Translation).
Abstract JP 5036532 (English Translation).

* cited by examiner

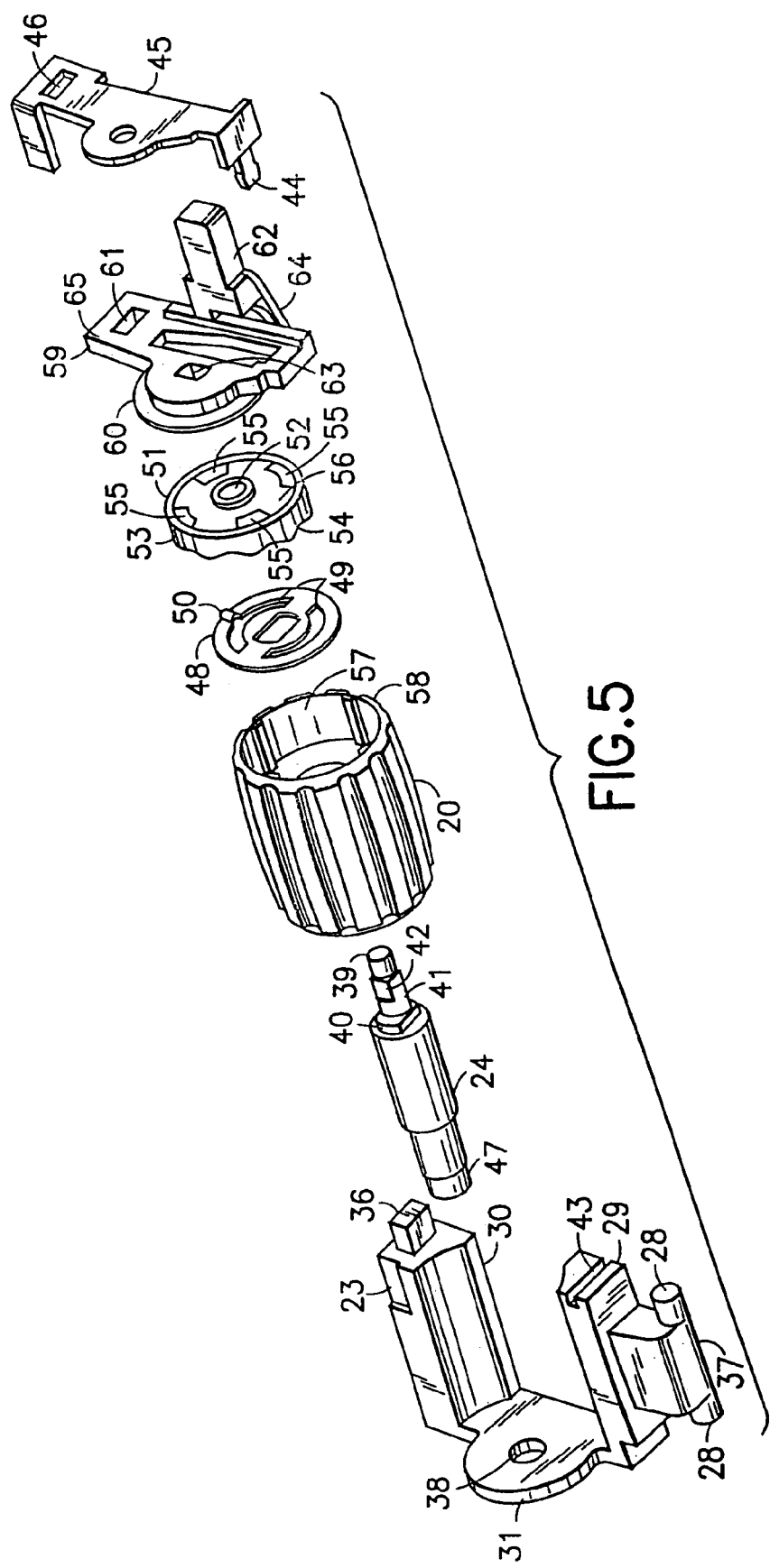

NAVIGATION KEY FOR A HANDSET

CROSS-REFERENCE TO RELATED APPLICATIONS

This application is a divisional of application(s) No. 08/923,686, filed on Sep. 4, 1997, now U.S. Pat. No. 6,097,964, from which priority is claimed and the disclosure of which is incorporated herein by reference in its entirety.

BACKGROUND OF THE INVENTION

The invention relates to a new and improved user interface (UI) for a telephone handset. The UI of hand portable phones for cellular or cordless systems does not just support the call handling alone. In the recent generations of hand portable phones more and more new applications have been integrated in the phones. One of the latest applications is web browsers, e.g. the one offered by Unwired Planet.

Navigation among the menu items, handling of the individual applications and editing of text as input for the applications are very difficult to perform, because the most commonly used type of navigation is carried out by an up/down scroll key. When pressing the key three times, the cursor moves three steps. Scrolling in this way through the menu or through the phone book is very time-consuming.

EP 463856 B suggests to substitute the scroll key with a roller ball or a thumb wheel. However, it is difficult to implement a roller ball known from a computer mouse into a hand portable phone. Today, the size of hand portable phones is comparable with the size of a mouse device for a computer.

However, a thumb wheel has now been implemented in a small portable phone, and this is described in EP 679003 A. This thumb wheel is placed in the upper left corner of the phone. The wheel is quite small, but the diameter still prohibits a more user-friendly positioning. In general, the user wants to operate the phone by using only one hand, but the position of the thumb wheel forces the user to use a two-hand grip—the right thumb for operating the keys on the front cover and the left thumb for operating the thumb wheel. This means that the user is not able to make a call from the phone book when he is carrying a bag or just writing with the other hand. Left-handed users are compelled to use a right-handed grip.

SUMMARY OF THE INVENTION

In accordance with the invention there is provided a telephone handset having a front surface with a display and a keypad, wherein said keypad includes a group of keys for entering alphanumeric signs and a key for navigating a cursor in the display, said navigation key is placed in the front surface of the phone between the display and the group of alphanumeric keys, said navigation key includes a roller body which extends partly though an opening in the front surface of the phone, and which is essentially cylindrical with a length and diameter of the same size as the width of the keys in said group of keys for entering alphanumeric signs. With the roller concept according to the invention the roller body will have a well-defined axis of rotation, and by providing the roller body with a cylindrical shape a part of the micro mechanics may be placed internally in the phone.

The invention provides a new and improved user interface for a telephone handset, said user interface including a roller body for scrolling though the items in the display and allowing the user to handle it by a one-hand grip.

When the axis of rotation of the roller is provided such that it extends perpendicularly to the longitudinal axis of the phone, the scrolling through the items in the menu will be performed like the traditional scrolling, but the scrolling will be much faster. The user is allowed to slow down the speed of the scrolling when he is near the desired item.

When the keys are arranged such that the navigation key is placed as an extension of the central column of the group of keys for entering alphanumeric signs, the navigation key is positioned in the resting point for the thumb. This is ergonomically a very good solution.

The phone is provided with means for detecting the rolling and depression of the navigation key, and the output from the detection means is fed to the controller which moves the cursor between items displayed in the display in dependence on the signal generated by the rolling and selects an item pointed out by the cursor in dependence on the signal generated by the depression.

The invention furthermore relates to a telephone handset having a front surface with a display and a keypad, wherein said keypad includes a key for navigating a cursor in the display controlled by a control unit. The navigation key is provided as a depressable roller body, and the control unit receives a first input signal representing the rolling of the roller body and a second input signal representing the pressing of the roller body for moving the cursor between items in the display and for selecting an item pointed out by the cursor, respectively. According to the invention the processor displays a list of available operations in the display upon pressing the roller body when the handset is in idle mode. Hereby it is possible to integrate a hot key or a power soft key functionality into the navigation key and to perform many of the most common operations by pressing and rolling this single navigation key. The power soft key list may be specified by the user.

The navigation key is very small according to the preferred embodiment, i.e. the length of said navigation key is of the order of 6–14 mm, and the maximum diameter of the roller body is of the order of 6–12 mm, thereby allowing the navigation key to be placed between the front cover of the phone and the main printed circuit board.

According to the preferred embodiment of the handset according the invention, the structure of the navigation key for providing control signals in dependence on the operation thereof comprises a roller body acting as a navigation key, a carrier for carrying said roller body, a supporting means supporting said carrier, said carrier being hinged relative to the supporting means by cooperating hinging parts, biasing means for urging the carrier and the supporting means away from each other at a distance from said hinging parts, and detection means for detecting a force counteracting the biasing force provided by said biasing means and for providing a second control signal in dependence thereon. Hereby it is ensured that the depression movement at the return movement is well-defined without any risk of the structure being locked unintentionally due to friction.

The carrier furthermore carries an encoder means aligned with the roller body for detecting the rotation of said body and for providing a first control signal in dependence thereon. According to the preferred embodiment of the invention the encoder means interacts with an electrical readable pattern provided on one end face of the roller body—actually the end face is protected by a surrounding collar partly protecting the engagement between the sliding shoe of the encoder and the electrical areas in said pattern.

The invention furthermore relates to a navigation key structure. The navigation key structure provides control signals in dependence on the operation of a roller body acting as a navigation key in the structure. The structure furthermore comprises a carrier for carrying said roller body, supporting means supporting said carrier, said carrier being hinged relatively to the supporting means by cooperating hinging parts. Biasing means is provided for urging the carrier and the supporting means away from each other at a distance from said hinging parts. Detection means is provided for detecting a force counteracting the biasing force provided by said biasing means and for providing a control signal in dependence thereon. Hereby it is ensured that the depression movement at the return movement is well-defined without any risk of the structure being locked unintentionally due to friction. Due to the architecture of the navigation key structure the overall size may be so small that the navigation key may be integrated in an existing UI concept for a phone, giving the user easy and substantially improved access to the functionality of the phone.

The roller body is arranged rotatably on a shaft part of the carrier, said shaft part being retained between two plate-shaped end parts, said end parts being furthermore adjoined by at least one beam-shaped leg part extending along the shaft part. Hereby the carrier is connected with the front cover/printed circuit board (the supporting means) via a hinged connection, and the roller is pivotally connected with the carrier. Hereby two pivotal movements are used, while the state of the art in general uses one pivotal movement and one linear movement. The two axes of rotation may advantageously be parallel.

The two plate-shaped end parts and said at least one beam-shaped leg part provide a stiff structure for the carrier. Preferably, the carrier comprises two leg parts in parallel with the shaft part, and the hinge part of the carrier extends outwardly from one of said leg parts.

The roller body is formed as a barrel having a through bore for receiving said shaft part. Internally, the diameter of the through bore of the roller member expands at one end of the member for providing the roller body with a cavity containing a cam-shaped disc member for cooperation with a spring member fixed to said shaft part, thereby defining a number of discrete positions allowable during the revolution of the roller body. The cam-shaped disc member acts as an end wall for the chamber and is provided with a central opening for the shaft part.

The carrier furthermore carries an encoder means aligned with the roller body for detecting the rotation of said body and for providing a control signal in dependence thereon. The encoder means interacts with a pattern readable by the encoder means, and said pattern is provided on the outer surface of the disc-shaped member.

The encoder unit according to the invention is adapted for use in a telephone handset having a navigation key which is provided as a roller body. The roller body is provided with a pattern which is readable by the encoder unit, and said roller body is allowed to adopt a predetermined number of valid states. Upon detection of a change of state for said roller body, the encoder unit actively checks whether the detected change of state is valid. Advantageously this is done by successively testing the contact between the sliding shoes and the pattern one by one, said testing being performed by applying a signal to one of the sliding shoes and detecting the response on the other sliding shoes. Hereby the contact between the sliding shoes may be tested and compared with a table including the valid states.

According to the invention a roller key structure is placed between a display and a group of alphanumeric keys and is used as a navigation key for a cursor in a display of a cellular or cordless phone, wherein the size of the part of said roller key that extends through the front cover of the phone corresponds to the general size of the keys in the group of alphanumeric keys.

BRIEF DESCRIPTION OF THE DRAWINGS

FIG. 5 shows the roller key structure shown in FIG. 3 in exploded view.

DETAILED DESCRIPTION OF THE INVENTION

Figure 1:
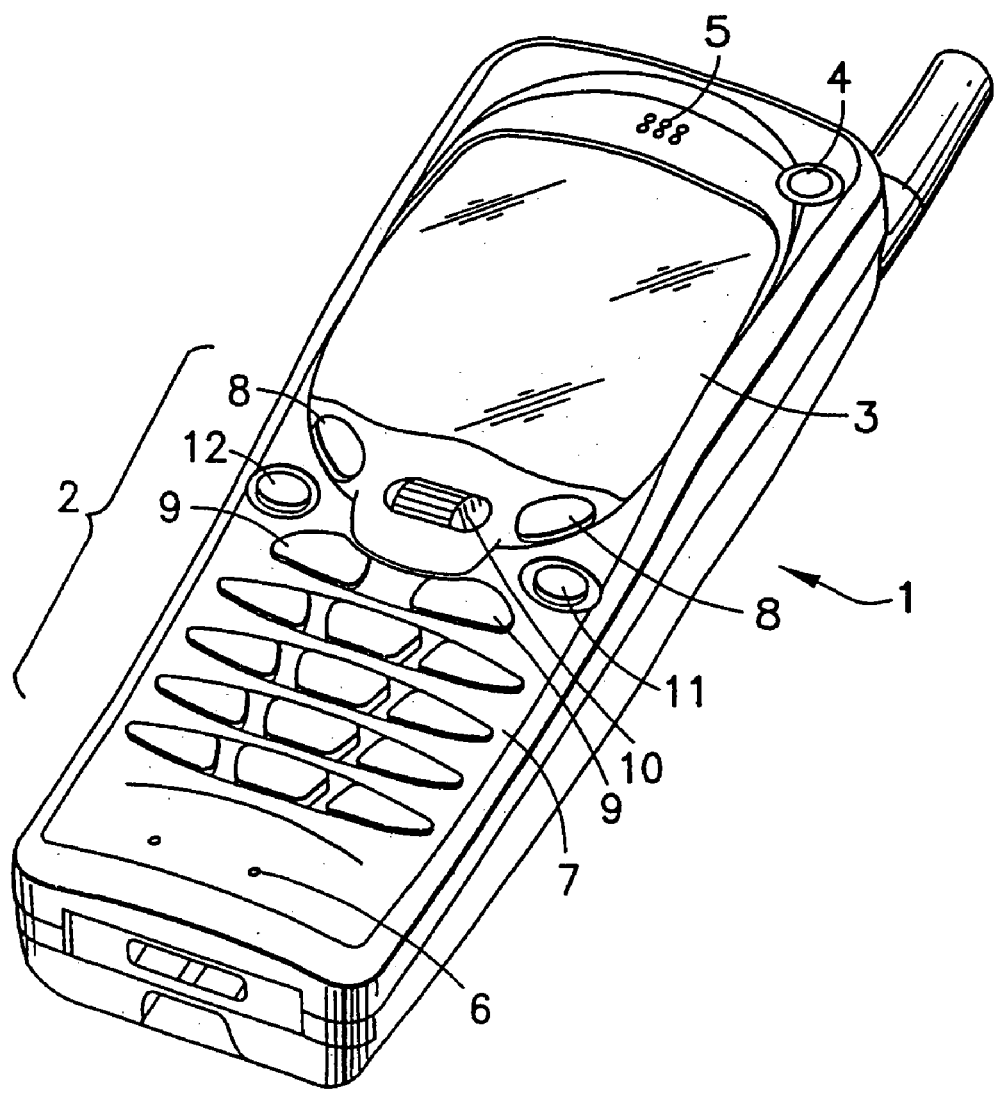
FIG. 1 schematically illustrates a hand portable phone having a having a navigation key according to the invention.

FIG. 1 shows a preferred embodiment of a phone according to the invention, and it will be seen that the phone, which is generally designated by 1, comprises a user interface having a keypad 2, a display 3, an on/off button 4, an earpiece 5, and a microphone 6. The phone 1 according to the preferred embodiment is adapted for communication via a cellular network, but could have been designed for a cordless network as well. The keypad 2 has a first group 7 of keys as alphanumeric keys, by means of which the user can enter a telephone number, write a text message (SMS), write a name (associated with the phone number), etc. Each of the twelve alphanumeric keys 7 is provided with a figure "0–9" or a sign "#" and "1", respectively. In alpha mode each key is associated with a number of letters and special signs used in the text editing.

The keypad 2 additionally comprises two soft keys 8, two call handling keys 9, a navigation key 10, a key 11 switching between alpha mode and numeric mode and a clear key 12.

The two soft keys 8 have a functionality corresponding to what is known from the phones Nokia 2110, Nokia 8110 and Nokia 3810. The functionality of the soft key depends on the state of the phone and the navigation in the menu by using a navigation key. The present functionality of the soft keys 8 is shown in separate fields in the display 3 just above the keys 8.

The two call handling keys 9 according to the preferred embodiment are used for establishing a call or a conference call, terminating a call or rejecting an incoming call. The clear key 12 may be used e.g. for erasing the digit or letter entered last by brief depression, while depression of a longer duration will erase the entire number or word. The key 11 switches between alpha mode and numeric mode in a text editing mode.

The navigation key 10 is placed centrally on the front surface of the phone between the display 3 and the group of alphanumeric keys 7. Hereby the user will be able to control this key with his thumb. This is the best site to place an input key requiring precise motor movements. Many experienced phone users are used to one-hand handling. They place the phone in the hand between the finger tips and the palm of the hand. Hereby the thumb is free for inputting information.

The navigation key 10 includes a roller body 20 (see FIG. 3) which extends partly though an opening in the front cover 21 of the phone, and said roller body 20 is essentially cylindrical with a length and diameter of the same size as the width of the keys in the alphanumeric group of keys 7. When the axis of rotation of the roller body 20 is provided such that it extends perpendicularly to the longitudinal axis of the phone 1, the rolling of the roller body 20 will move a cursor in the display in an up/down direction corresponding to the movement of thumb. The navigation key structure is furthermore provided with a micro switch 33 or detecting the depression of the roller body 20, thereby providing a selection signal for the processor 17 indicating that the item pointed out in the display has been selected.

When the navigation key 10 is arranged as an extension of the central column of the alphanumeric keys 7, the navigation key can be accessed optimally by both left- and right-handed users.

Figure 2:
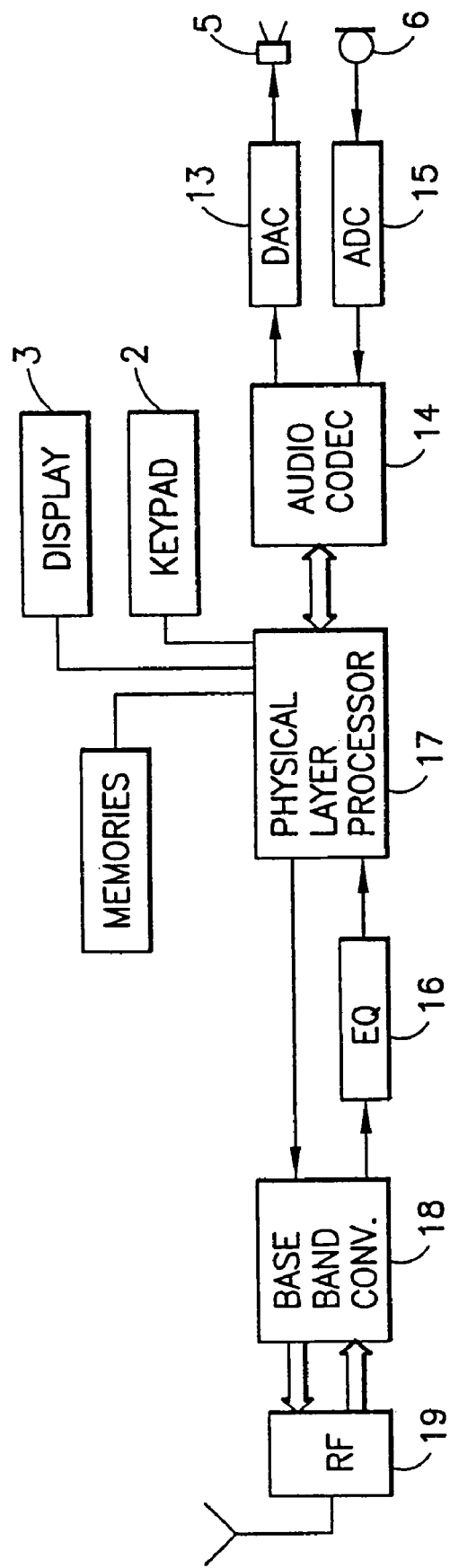
FIG. 2 schematically shows the essential parts of a telephone for communication with a cellular or cordless network.

FIG. 2 schematically shows the most important parts of a preferred embodiment of a portable phone, said parts being essential to the understanding of the invention. The preferred embodiment of the phone of the invention is adapted for use in connection with the GSM network, but, of course, the invention may also be applied in connection with other phone networks, such as cellular networks and various forms of cordless phone systems. The microphone 6 records the user's speech, and the analog signals formed thereby are A/D converted in an A/D converter 15 before the speech is encoded in an audio codec unit 14. The encoded speech signal is transferred to a physical layer processor 17, which e.g. supports the GSM terminal software. The processor 17 also forms the interface to the peripheral units of the apparatus, including the memories (RAM, ROM), the display 3 and the keypad 2 (as well as SIM, data, power supply, etc.). The processor 17 communicates with the RF part 19 via a baseband converter 18 and a channel equalizer 16. The audio codec unit 14 speech-decodes the signal, which is transferred from the processor 17 to the earpiece 5 via a D/A converter 13. The units 13–18 are usually integrated in a chip set—either a commercially available one or in a set of specially designed chips (ASIC's).

The processor 17, which serves as the controller unit in a manner known per se in the preferred embodiment, is connected to the user interface. Thus, it is the processor which monitors the activity in the phone and controls the display 3 in response thereto.

Therefore, it is the processor 17 which detects the occurrence of a state change event and changes the state of the phone and thus the display text. A state change event may be caused by the user when lie activates the keypad including the navigation key 20, and this type of events is called entry events or user events. However, also the network in communication with the phone may cause a state change event. This type of events and other events beyond the user's control are called non user events. Non user events comprise status change during call set-up, change in battery voltage, change in antenna conditions, message on reception of SMS, etc.

The Roller Key

The roller key according to the invention replaces the scroll key normally used by the applicant for moving the cursor in the display in an upward and a downward direction. The user may revolve the roller according to the invention to move the cursor through a number of listed items in the display, and press the roller to select one of the displayed items.

According to the preferred embodiment the roller body will have twelve positions per revolution. Each of these twelve positions will be mechanically well-defined, and the user will have to provide a rolling force of a certain level (e.g. above 1 N) in order to come to the next discrete position. In the preferred embodiment the outer cylindrical surface of the roller key is provided with 12 axial slots for providing a better grip.

When pressing the roller, the required pressing force should be sufficient to avoid unintended selections during scrolling. The required selection force could be three times (e.g. above 3 N) the required rolling force.

Figure 6:
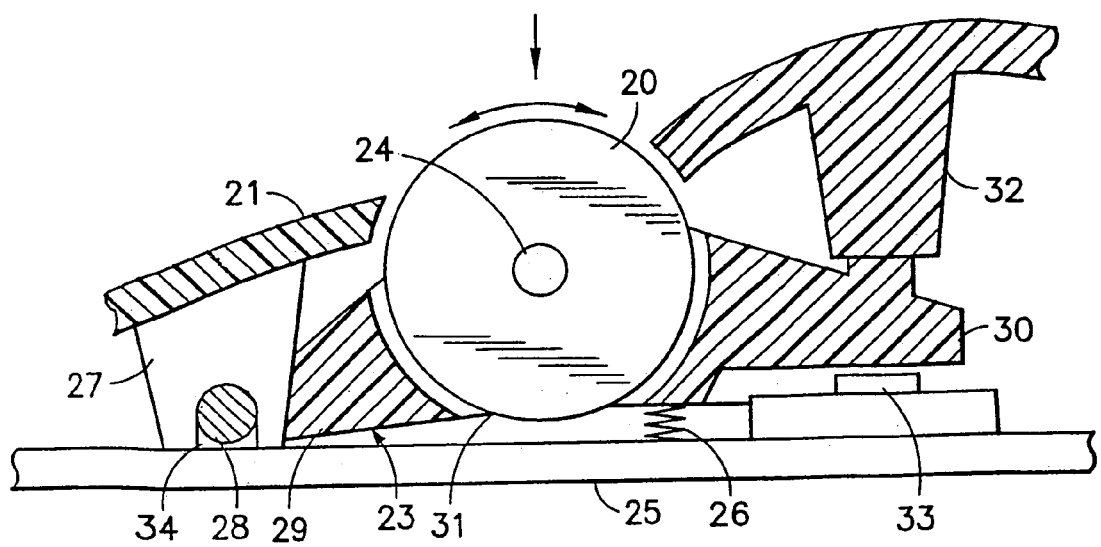
FIG. 6 schematically and in cross-section shows the part of the phone shown in FIG. 1 including the navigation key according to the invention.
Figure 7:
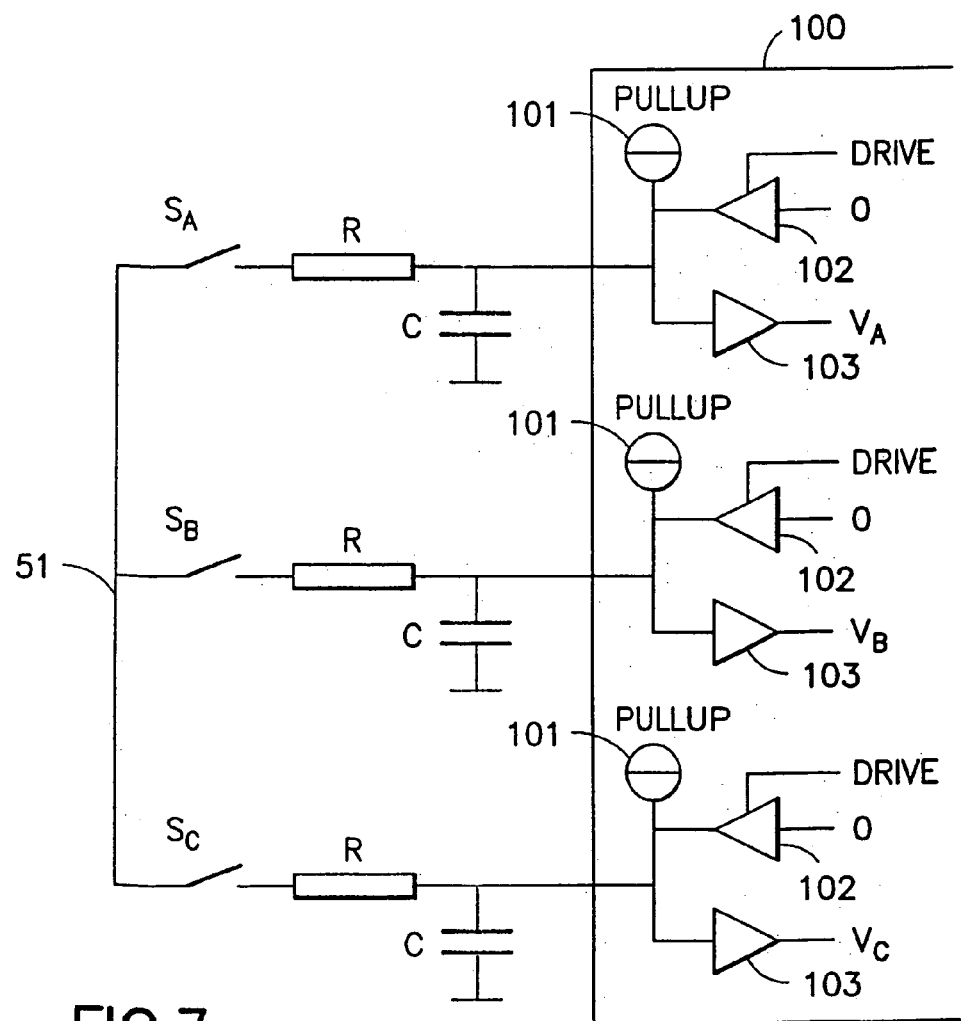
FIG. 7 schematically shows a circuit diagram showing the encoder concept according to the invention.

FIG. 6 illustrates how the navigation key structure according to the invention is placed in a hand portable phone. The navigation key structure comprises a roller body 20 acting as a navigation key and a carrier 23 for carrying the roller body 20. The carrier 23 comprises a beam 29 carrying the stub shaft 28 as hinge parts, a beam 30 and a shaft 24 carrying the roller body 20. The two beams 29, 30 and the shaft 24 are parallel and are interconnected by bearings 31, 35 at each end.

A part of the roller body 20 extends through a close fitting opening (no contact) of the front cover 21 of the phone. The rear side of the front cover 21 is provided with two gripping arms 27 having U-shaped recesses 34 for receiving stub shafts 28, thereby, as a supporting means, defining a hinge axis for the carrier 23. The gripping arms 27 act as spacer members between the front cover 21 of the phone and the printed circuit board (PCB) 25. The latter constitutes a locking member for the shaft bearing provided by the recesses 34 of the gripping arms 27. The distance between the gripping arms 27 is slightly smaller than the length of a shaft body 24 to avoid axial displacement of the carrier 23.

A spring 26 is provided as a biasing means for urging the carrier 23 away from the printed circuit board 25 towards the front cover 21 of the phone. The front cover 21 is provided with two stop legs 32 which cooperate with an upper surface of the part 30 of the carrier facing away from the hinge 28,34. The lower surface of carrier part 30 is adapted for cooperation with a micro switch 33. The distance between the contact faces on the micro switch 33 and the stop legs 32 is slightly greater (preferably about 0.5 mm compared with the full width of the structure which is about 15–20 mm) than the thickness of the corresponding carrier part. The coil 26 urges the carrier 23 towards the stop legs 32. When the user depresses the roller with a force greater than the coil force (e.g. 3 N corresponding to appox. 300 g), the carrier will be urged against the micro switch 33 giving an output signal in dependence thereon. The micro switch 33 acts as a detection means for detecting the force counteracting the biasing force provided by the coil 26.

When the roller body 20 is depressed, the whole navigation key structure performs a swing movement around the hinge axis defined by the gripping means 28, 34.

Figure 4:
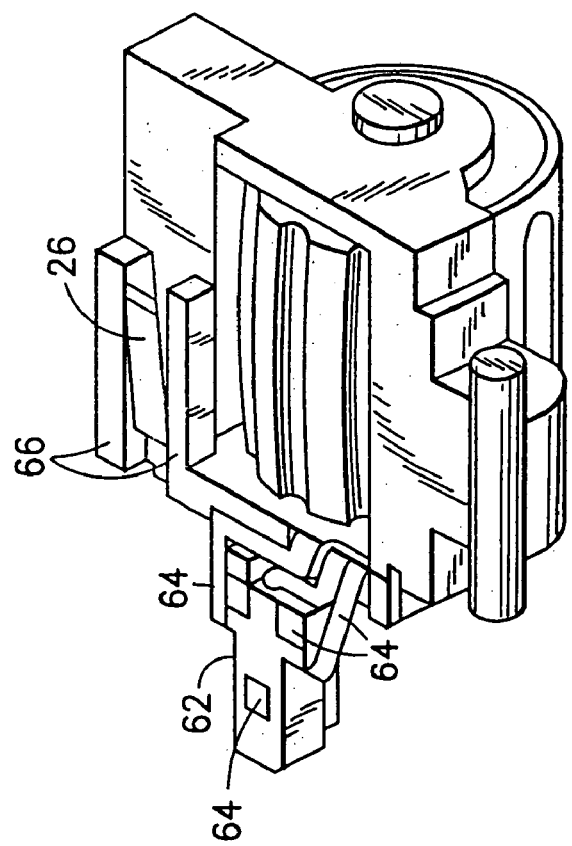
FIG. 4 shows the roller key structure shown in FIG. 3 from below.
Figure 3:
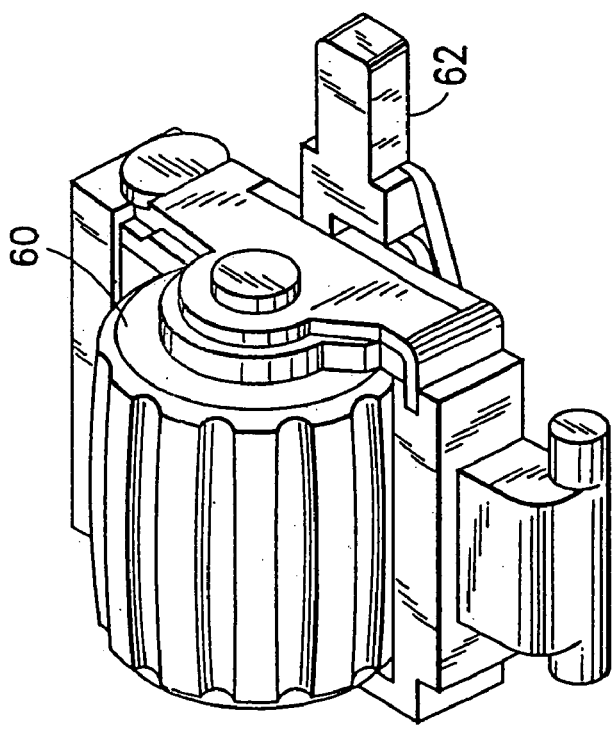
FIG. 3 illustrates a preferred embodiment of the roller key structure according to the invention.

The preferred embodiment of the navigation key structure according to the invention is shown in FIGS. 3–5. FIG. 5 shows the individual parts of the navigation key structure. The main body of the carrier 23 is provided as an integral body by injection molding and comprises a plate-shaped end part with a central bore 38 as a bearing 31. One beam 29 extending from the bearing 31 is provided with a projection 37 carrying the stub shafts 28. The end face of the beam 29 is provided with a slot 43, and a locking recess is provided in the central part of the bottom of the slot 43. During the assembly of the structure a barbed tongue 44 on a metallic locking member 45 is received permanently in the locking recess.

The other beam 30 extending from the bearing 31 is provided with a locking pin 36 at the end face, said locking pin 36 being received through a locking hole 46 on the locking member during the assembly of the structure. When assembled, the pin 36 is heated and deformed so that the locking member 45 is locked permanently to the carrier 23.

One end 47 of the shaft 24 is provided with a stepwise decreasing diameter. The tip of this end 47 is adapted to be received in the bore 38 during assembly. The first shoulder of the shaft end 47 engages the bearing 31, and the second shoulder engages a corresponding part internally in the roller body 20 which prevents axial displacement of the body 20 in relation to the shaft 24.

The other end of the shaft 24 is provided with a locking segment 40 on which a metallic disc 48 is received. The disc 48 has two semi-circular slots 49 whereby an outer ring of the disc is provided with resilient properties. During stamping of the disc 48 a knob 50 is provided on this outer ring.

Next to the locking segment 40 there is provided a cylindrical segment 41 on which a plate-shaped plastics member 51 is placed. The plate-shaped member 51 has a central bushing 52 engaging the cylindrical segment 41 of the shaft 24, an outer bushing 53 having a wave-shaped cam part 54 facing towards the metallic disc 48, and a disc part having a pattern of conducting areas 56 and non-conducting areas 55. In the preferred embodiment these areas are provided as a ring-shaped area divided into eight angular segments (600 conducting segment 56 and 30° non conducting segment 55 and so on). The conducting segments 56 are interconnected via the central part of the disc.

The metallic pattern 56 is a part of the encoder for the roller, and the plate-shaped plastics member 51 and the metallic disc 48 are received in a cavity 57 provided in the roller body 20, in which four co-axial beams 58 fix the member 51 in relation to the roller 20.

An encoder unit 59 has a circular disc member 60 acting as an end wall for the internal cavity 57 in the roller body 20 containing the cam-shaped disc member 51, the spring member 48 and the shaft 24. The encoder unit 59 comprises a main body 65 and a terminal part 62.

These two parts are provided with three metallic strips 64 as resilient connectors by injection molding. From the disc member 60, one end of each of these three strips 64 acts as a sliding shoe acting as an encoder terminal in electrical contact with the pattern of conducting area 56. From the disc member side, the three strips 64 pass through the main body 65 to the opposite wall and into the terminal part 62. The central parts of the strips 64 act as springs between the main body 65 and the terminal part 62. The other ends of the metallic strips 64 act as terminal parts in a ball grid array like connector (FIG. 4), the connection being achieved by pressing the terminal part 62 towards corresponding pads on the printed circuit board 25.

Even though it is not shown, a person skilled in the art will understand how an appropriate projection corresponding to the gripping arms 27 extends from the inner surface of the front cover 21 and urges the terminal part 62 towards the printed circuit board 25. Hereby the main body 65 is allowed to travel the about 0,3–0,5 mm when the roller is depressed, without affecting the connections.

It will appear from the description how the encoder is able to detect when the roller body 20 has been turned. The encoder unit 59 further comprises a locking hole 61 aligned with the locking hole 46, and a shaft hole 63 with a profile corresponding to the cross-section of a locking segment 42 of the shaft 24.

When the parts of the roller body 20 have been assembled, an axial force is applied to some part of the assembly. Hereby the barbed tongue 44 is urged into the slot 43, and the locking pins 36, 39 are plastically deformed to avoid disassembly of the body 20. This can be seen from FIG. 3. It appears from FIG. 4 that the spring 26 according to the preferred embodiment is provided as a resilient metal strip anchored in the beam 30 actuating the micro switch 33. As will be seen, the spring 26 is placed in a track between two spacer members 66 protecting the micro switch 33.

The Encoder

According to the preferred embodiment the three terminals travel along a circle inside the segmented pattern 55, 56. With an angular spacing between the terminals of the size of 30°+/− a multiple of 90°, this will give 12 states of 30° width per full turn of the roller 20. The knob 50 and the wave-shaped cam member 54 have to be designed so that the force acting on the resilient ring is minimum in the central part of the 30° interval. The roller may hereby obtain unstable equilibriums centrally in the twelve discrete positions corresponding to the twelve states.

By detecting the relative connection between the metallic strips 64 the processor 17 is able to detect the movement of the roller body 20. When the roller is rolled, the metallic strips 64 are successively interconnected via the pattern of conductive and non conductive areas 55, 56 provided on the outer surface of the disc-shaped member 51.

Figure 8:
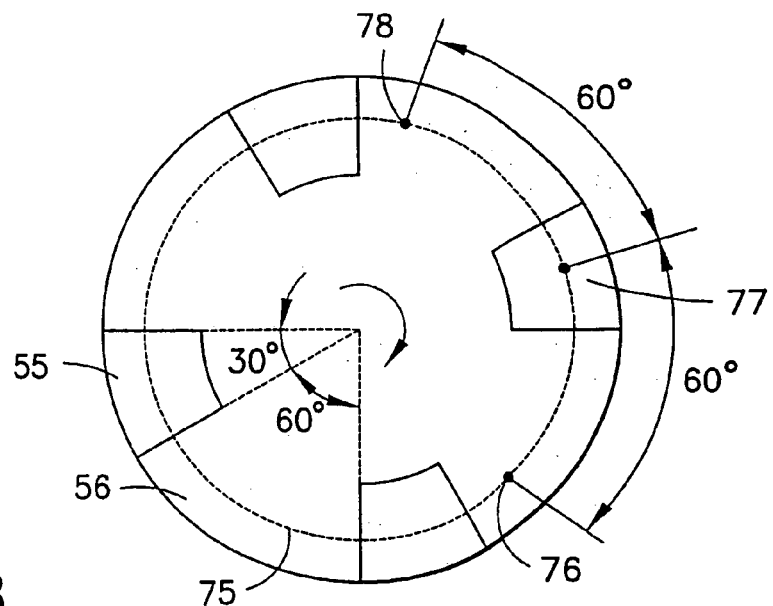
FIG. 8 shows how the switches in FIG. 7 are opened and closed when turning the roller.
Figure 9:
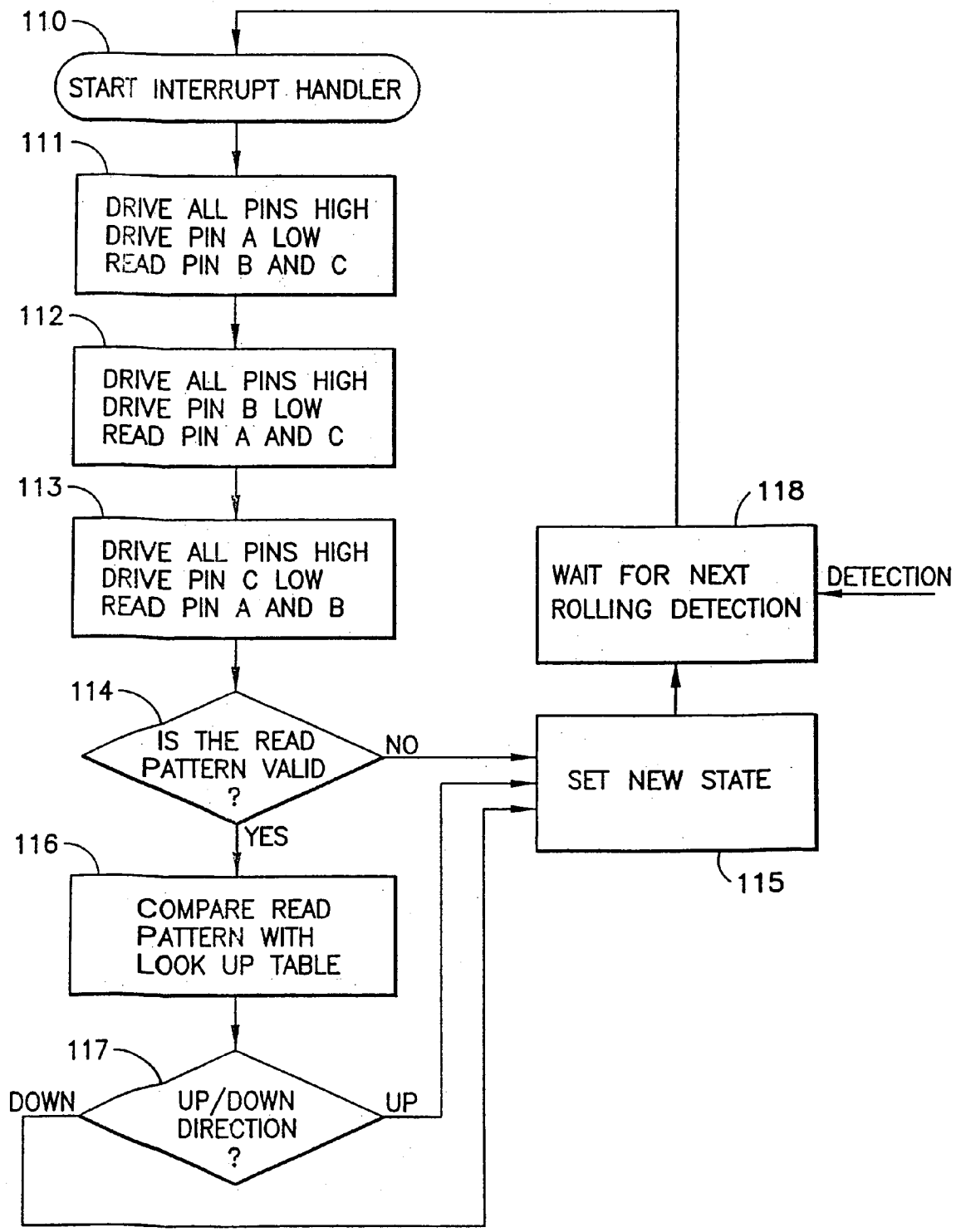
FIG. 9 shows a flow diagram illustrating the interrupt handling routine used for actively controlling state changes according to the invention.

As will be seen from FIG. 8, the sliding shoes 76–78 (contact springs) of the metallic strips 64 each slide along a circular path 75. According to the preferred embodiment the three paths are coincident. It is furthermore shown how the three sliding shoes 76–78 have relative angular spacings corresponding to 600. One of the three sliding shoes is not connected to the other two via the conducting area 56. With twelve states per full turn a state is provided as a 30° segment. The angular spacing between the first and second sliding shoes, e.g. 76 and 78, has to be 30° (corresponding to contact in different segments) plus N×90° (a full turn corresponds to four identical periods each containing three states), and here the angular spacing is 120°. The angular spacing between the first and third sliding shoes 76, 77 has to be 60° (corresponding to contact in different segments—also differing from the segment of the second sliding shoe) plus M×90°, and here the angular spacing is 60°.

Based on this, the pattern in table 1 represents the expected reading from the switches $S_A$, $S_B$ and $S_C$ in the encoder. A switch is open when the corresponding sliding shoe 76–78 contacts a non conductive area 55 and closed when the sliding shoe 76–78 contacts a conductive area 56.

TABLE 1

| Segment | Angle interval | $S_A$ | $S_B$ | $S_C$ |
|---|---|---|---|---|
| 1 | 0°–30° | open | closed | closed |
| 2 | 30°–60° | closed | open | closed |
| 3 | 60°–90° | closed | closed | open |
| 4 | 90°–120° | open | closed | closed |
| 5 | 120°–150° | closed | open | closed |
| 6 | 150°–180° | closed | closed | open |
| 7 | 180°–210° | open | closed | closed |
| 8 | 210°–240° | closed | open | closed |
| 9 | 240°–270° | closed | closed | open |
| 10 | 270°–300° | open | closed | closed |
| 11 | 300°–330° | closed | open | closed |
| 12 | 330°–360° | closed | closed | open |

According to the invention the processor 17 actively checks whether the read pattern is valid or not. This is necessary because the roller body 20, when the whole roller assembly 20, 23 is pressed, might turn slightly. Due to the size of the overall structure this may cause one of the sliding shoes 76–78 to move onto dust particles and thereby lose contact. If such a situation is not detected, this may cause the cursor 72 in the menu to move one step up or down just before the selection. This will result in an activation of a wrong application.

To avoid such erroneous detections, the processor 17 according to the invention initiates a basic software routine to determine the position of the roller. The processor 17 is connected to the encoder via an ASIC 100. The ASIC 100 includes three identical circuits—one for each encoder switch $S_A$, $S_B$ and $S_C$. Each of these circuits contains a drive part 102 for driving the corresponding sliding shoe 76–78 logical high or low. A pull-up circuit 101 pulls the voltage level up to an appropriate level, and an amplifier 103 amplifies the output from the sliding shoe for further processing. The three ASIC pins are connected to the switches $S_A$, $S_B$ and $S_C$ via respective RC circuits (filters).

When the processor 17 detects a turning of the roller via a change on the output $V_A$, $V_B$ and $V_C$, it starts (step 110) an interrupt handling routine. In step 111 all the three pins from the ASIC 100 are driven high by the drive circuits 102, and the pin corresponding to the sliding shoe in the switch $S_A$ is driven low. Then the logical state of the other two pins is read. In steps 112 and 113 the same procedure as in step 111 takes place, except that it is the pins corresponding to the sliding shoes in the switches $S_B$ and $S_C$ that are successively driven low followed by a reading of the other two states.

In segments 4–6 in table 1 the sliding shoes of the switch $S_A$, $S_B$ and $S_C$ are successively in contact with the non conducting area 55, and therefore the interrupt handling routine would give the readings of table 2.

TABLE 2

| Segment | interrupt handling routine | $S_A$ | $S_D$ | $S_C$ | output |
|---|---|---|---|---|---|
| 4 | step 111 | drive low | high | high | |
|   | step 112 | high | drive low | low | |
|   | step 113 | high | low | drive low | |
|   | step 115 | | | | 3 -> 4 |
| 5 | step 111 | drive low | high | low | |
|   | step 112 | high | drive low | high | |
|   | step 113 | low | high | drive low | |
|   | step 115 | | | | 4 -> 5 |
| 6 | step 111 | drive low | low | high | |
|   | step 112 | low | drive low | high | |
|   | step 113 | high | high | drive low | |
|   | step 115 | | | | 5 -> 6 |

It will be seen from table 2 that driving a sliding shoe 76–78 low when it is connected to a non conducting area 55 does not affect the logical state of the other pins. When two pins are connected to each other via the conducting area 56, driving one of these pins low will cause the other to go low too.

In the described embodiment the three patterns corresponding to the segments 4–6 in table 2 are the only three valid patterns. In step 114 the processor 17 checks whether the pattern determined by the readings in steps 111–113 is a valid pattern—if not the processor 17 in step 115 recognizes the turning that initiated the routine as being a false alarm and deems the roller not to be turned. Then the processor 17 in step 118 starts waiting for the turning detection to initiate the routine once more.

If the pattern in step 114 is recognized as being a valid pattern, the processor 17 in step 117 compares the pattern with the pattern for the old state to determine whether the roller is turned in an upward or a downward direction. The new state is identified in dependence on this, and the processor 17 moves the cursor 72 in the display accordingly. Then the processor 17 in step 118 starts waiting for the turning detection to initiate the routine once more.

An invalid pattern is regarded as a fault situation and is not used for the cursor navigation. Instead the processor 17 waits for the next valid reading and then uses this for the cursor navigation. Confirmation or selection is performed by pressing the entire roller assembly, and this activates a key (the micro switch 33) in the keyboard assembly of the phone.

According to the preferred embodiment of the phone, the maximum rotation rate of the roller body 20 is expected to be around twenty state changes per second.

The Functionality of the Roller Key

In addition to the navigation in the menu and in the phone book of the phone, the roller according to the preferred embodiment of the invention may be handled as a third soft key (power soft key) that contains user-defined options and thereby the favorite options of the user. The power soft key can be defined to fit the specific requirements of the user. It should for instance be possible to define the power soft key to be an easy dial key, entering a certain menu, toggling ringing on/off, etc. Compared with the generally used UI concept of the applicant known from Nokia 2110, Nokia 8110 and Nokia 3810, the power soft key will replace the up/down scroll key and act as a central soft key.

According to the preferred embodiment of the invention the power soft key will only be present in idle mode, which means not in menu, memory, etc. Hereby the power soft key will not be available during dialogue—either speech or data.

In idle mode of the phone, pressing the roller key 20 is used for accessing a so-called "roller menu". The "roller menu" is an improvement of the "power soft key" or "hot key" known per se, and, according to the preferred embodiment, contains important functions as well as a number of user-defined favorite operations.

The "roller menu" hence has some main advantages. First of all the "roller menu" provides very easy access to re-dial list, phone book and menu functions—solely using the roller. Furthermore, the user is allowed to personalize his phone, which means offering an easy accessible list e.g. containing his favorite menus, web addresses, name entries or user-friendly access to voice dialing.

Furthermore, the "roller menu" makes it easier for the user to understand that the roller key 20 contains access to voice dialing, just as it makes the addition and the deletion of favorite items more obvious and thereby the menu more dynamic.

Figure 10:
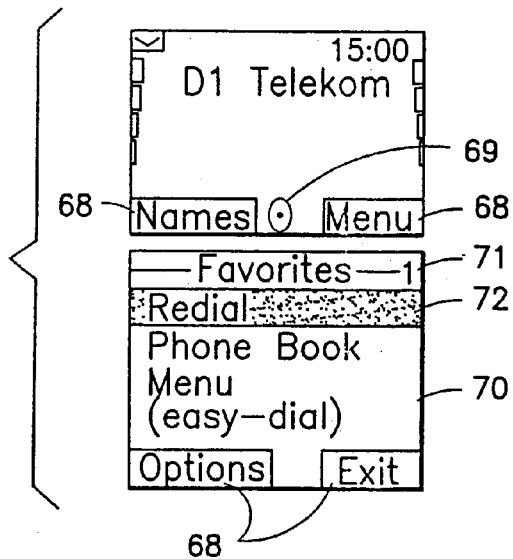
FIG. 10 shows the idle mode display and the power soft key menu display of the phone according to the invention.

When the cellular phone according to the invention is in idle mode, the display 3 may advantageously look as the upper image of FIG. 10. An upper row in the display contains predefined icons indicating certain conditions of the phone, e.g. the envelope indicates that the phone has received an SMS message not yet read. Other icons may indicate the reception of voice mail, status of alphanumeric keypad, data transmission, etc. Time is displayed in the top right corner.

The display has two vertical status bars—the left one indicates the signal strength and the right one indicates the battery level. The name or logo of the present network operator is displayed in the central part of the display. At the bottom of the display two fields 68 display the present functionality of the soft keys 8, and between these two fields a separate icon 69 indicates that pressing the navigation key 10 gives access to the power key functionality.

When the power soft key functionality is placed in the roller navigation key 10 just below the display 3, the user gets a superb indication by the icon 69 that the navigation key 10 contains the power key functionality known per se. The use of the roller key having scrolling and selection functionality as a power soft key gives the user a superb opportunity to handle the major part of the activities with only one button. The use of a roller key as a navigation key just below the display gives the phone extraordinarily good qualities for one-handed use.

It should be noted that the power soft key icon 69 and functionality is only present in idle mode, while the navigation key 10 is used for navigation and selection purposes in the other modes.

Upon pressing of the navigation key 10, the phone enters the power soft key mode, and a user-defined list 70 containing the favorite operations of the user is displayed. The list is named "favorites", and the name is displayed at the top of the list. The first item in the list is marked by a cursor 72, which can be moved by rolling the navigation key 10, and the item pointed out may be selected by depressing the same key 10.

The user can scroll in the list and select a certain item by pressing the roller. Selection of the "menu" item will for instance enter the normal menu structure. The power soft key defines links or short-cuts to operations in the phone book or in the menu.

The power soft key menu may contain some user-defined favorite operations, and may advantageously contain three further items "re-dial", "names" and "menu".

Re-Dial

This item allows the user to re-dial the last dialed number, and/or to view the complete re-dial list. When the re-dial item is highlighted, the user has several options. By pressing the send key 9 or by long-pressing (for longer than e.g. 0.8 sec) the navigation key 10 the last dialed number is immediately re-dialed.

By pressing the navigation key 10 shortly, the complete re-dial list will be entered. From here, the user can scroll through the re-dial list with the navigation key 10, and then press the send key 9 or long-press the navigation key 10 to launch the call.

The re-dial functionality is provided in the power soft key menu, because it is desired to have easy one-hand access to this very basic function.

Name

Selection of this power soft key menu item with the navigation key 10 will access the normal names list (phone book) in the same way as pressing the "names" soft key 8 in idle mode (see FIG. 10, first image). Again, it is possible via "names" to highlight a name/phone number in the names list/phone book and to establish a call to the highlighted name/phone number by operating the navigation key 10 alone.

Menu

Selection of this power soft key menu item with the navigation key 10 will enter the normal menu structure in the same way as pressing the "menu" soft key 8 in idle mode (see FIG. 10, first image).

This "names" item and the "menu" item are duplicated here to allow the user to perform any operation with the navigation key 10.

Easy Dial

The easy dial item as default does not have any function, but is a user-friendly and obvious way for the user to define specific numbers to call when selecting this item. As long as the easy dial item has not been defined, the item will appear as "(easy dial)" in the power soft key menu, as indicated in FIG. 10.

When the easy dial number is highlighted by the cursor, but has not yet been defined, the first option on the left soft key may advantageously be define instead of select.

Options on Left Soft Key in Roller Menu

In the power soft key menu, the left soft key 9 is called "options". The option key accesses a list when selected, and this list allows the user to handle operations on the highlighted power soft key menu item, and it allows the user to add new favorite/bookmark items to the power soft key menu. The options list is a standard selection list, and the different options are described in the following.

Select/Call

The first option on the left soft key 9 in the power soft key menu depends on what item is currently highlighted in the roller menu. If e.g. "menu", "names" or another selectable item is highlighted, the first option is "select". If a specific number, or the "re-dial" item is highlighted, the first option will be "call".

Add Favorite

This item allows the user to add one of his own favorite functions to the power soft key menu. The added favorite will be added after the currently highlighted item in the power soft key menu.

Re-Define

This item allows the user to re-define the current power soft key menu item to another one. This is basically handled in the same way as adding a new favorite to the power soft key menu, except that the selected item will replace the currently highlighted item.

When "re-define" is selected, the type of the currently highlighted power soft key menu item will be suggested as default in the favorites selection list. This means that if e.g. the user re-defines an easy dial number, then the default highlighted favorite option type will be "easy dial".

Move to Top

This item allows the user to customize the ordering of the power soft key menu. When the "move to top" item is selected, the currently highlighted power soft key menu item will be moved to the very top of the power soft key menu.

By doing this repeatedly for several items, the user can customize the power soft key menu.

Remove

This item allows the user to remove an item from the power soft key menu. Preferably, the user will be asked to confirm the removal. The user can also remove the "standard" items in the power soft key menu, e.g. "re-dial", and add them again, if needed.

Re-Name

The "re-name" item allows the user to customize the power soft key menu, too. This is handled using the normal text editing windows, with the previous name as default, the editor limiting the maximum text to be entered to the screen width. The user can of course also re-name the "standard" items in the power soft key menu, e.g. "re-dial".

Assigning Favorites to the Power Soft Key Menu

The user is allowed to add a certain number (e.g. 20) of his own personal favorite features, numbers and bookmarks to the power soft key menu. With the present display size, e.g. four items could be displayed and the remaining number of operations is accessible by rolling the navigation key 10. As mentioned, the editing of the power soft key menu list is performed by the left "option" soft key 9 once the menu has been entered. The menu is escaped by pressing the right "exit" soft key 9.

In table 1 some examples of relevant menus are given.

TABLE 1

| Favorite item | Operation when selected |
| --- | --- |
| Network | Enter network type selection (dual mode phones) |
| Easy dial | Calling an entry from the memory |
| Call mailbox | Actually a sub-set of the above |
| Prev ringing vol | Toggling ringing volume between two settings. The user can define both settings. One setting is default silent |
| Prev alert type | Toggling between silent and normal sound mode. Ringing and beep settings are muted or set to some prespecified reasonable values, respectively |
| Write SMS | |
| Read SMS | |
| Last dialed calls | View last dialed calls list |
| Timer/costs | View last or all call timer/costs |
| Calculator | Direct access to calculator |
| Calendar | Direct access to calendar |
| Key tones on/off | |
| Lights on/off | |
| Light on for 20 sec. | Like on/off key |
| View last dial list | |
| Divert on/off | A divert to a user-defined phone number can be switched on and off. The user can also define divert type(s) (specific type, unconditional, all conditional, fax, data) |
| Prev diverts | Toggle between two diverts. The user can specify two phone numbers to divert to, and he specifies what divert type the diverts should be |

In general, everything possible in the menu and the phone book can be entered as items in the power soft key menu. One may regard the power soft key as a one level representation of the frequently used operations in the multi-level tree structure of the operations known per se in the menu of the phone.

Modes of the Phone

Figure 11:
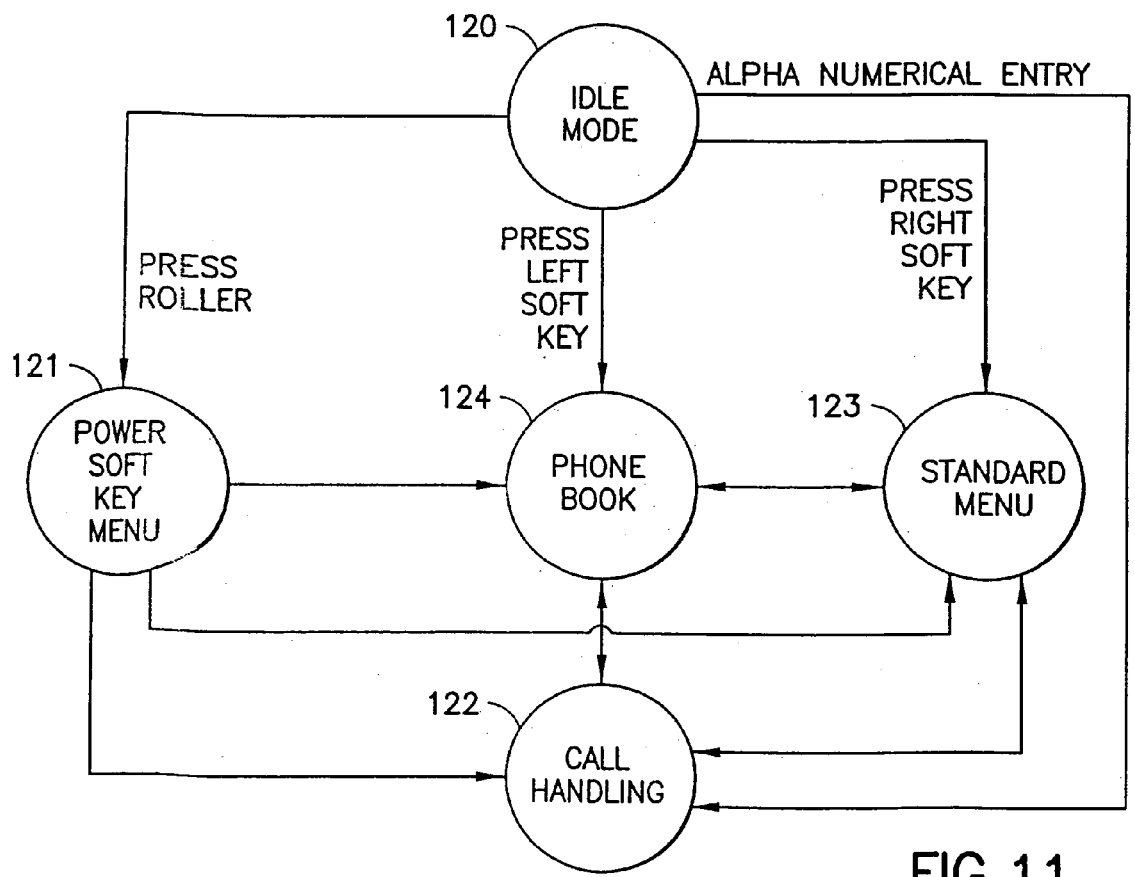
FIG. 11 shows a diagram illustrating the mode of the phone according to the invention.

When the phone is in idle mode, the basic activity of the phone is to monitor the network activities and the UI of the phone itself. In idle mode (120 in FIG. 11) the phone may display the idle mode display of FIG. 10.

When the user starts activating the alphanumeric keys 7, the phone enters a call handling mode 122 in which the phone is able to establish a call based on the entered number.

If, instead, the user presses the right soft key 8 in idle mode, the phone will enter a standard menu mode 123 in which all applications available in the phone will be available in a tree structure. These applications may include messages (including e.g. SMS messages and E-mails), a call register (including ingoing and outgoing calls and missed calls), access to a calculator and games, access to call divert settings, clock and phone setting and access to the phone book.

By pressing the left soft key 8 the user may enter the phone book mode 124 which is also available via the standard menu mode 123. In general, the user is able to jump between the modes 122, 123 and 124, e.g. for storing a phone number (entered in the call handling mode 122) in the phone book (mode 124) for finally sending an SMS message (mode 123). These three modes may be escaped by pressing the clear key 11, causing the phone to return to idle mode 120.

When, from idle mode 120, the user presses the navigation key 10 (roller key), the phone enters a power soft key mode 121 from which the user may enter a number of applications available in the phone in the phone book or in the menu or just to handle a call. The power soft key menu 70 is a user-specified list of short-cuts to applications available in a complex menu structure of the phone. The number of items is specified by the user, too.

What is claimed is:

1. A telephone handset having a front surface with a display and a keypad, wherein said keypad includes a group of keys for data entry and a key for navigating a cursor in the display and selecting an item in dependence of the position of the cursor:

said navigation and selection key positioned in the front surface of the phone between the display and the group of data entry keys;

said navigation and selection key includes a roller body acting as a navigation key which is essentially cylindrical with a length and diameter of substantially the same size as the width of the keys in said group of keys for entering alphanumeric signs, and extends partly through an opening in the front surface of the phone, and has an axis of rotation perpendicular to the longitudinal axis of the phone;

said roller body is fully rotatable and is allowed to adopt a predetermined number of valid positions during a rotation for moving the cursor, and can be depressed to request performance of an action in dependence of the position of the cursor, the structure of the navigation key comprising:

a roller body acting as a navigation key;

a carrier for carrying said roller body;

a supporting means supporting said carrier;

said carrier being hinged relative to the supporting means by cooperating hinging parts;

biasing means for urging the carrier and the supporting means away from each other at a distance from said hinging parts; and detection means for detecting a force counteracting the biasing force provided by said biasing means and for providing a second control signal in dependence thereon.

2. A telephone handset according to claim 1, wherein the keys in said group of keys are arranged in three columns each having four keys, and said navigation key is placed as an extension of the central column.

3. A telephone handset according to claim 1, and furthermore comprising:
   a first detection means for detecting the rotation of the roller and for providing a first control signal for the controller,
   a second detection means for detecting the depression of the roller and for providing a second control signal for the controller, and
   said controller moving the cursor between items displayed in the display in dependence on the first control signal and selecting an item pointed out by the cursor in dependence on the second control signal.

4. A telephone handset according to claim 1, wherein the length of said navigation key is of the order of 6–14 mm, and the maximum diameter of the roller body is of the order of 6–12 mm.

5. A telephone handset according to claim 1, wherein the carrier furthermore carries an encoder means aligned with the roller body for detecting the rotation of said body and for providing a first control signal in dependence thereon.

6. The telephone handset of claim 1 wherein a position of the navigation and selection key is determined to enable one handed operation of the phone.

7. The telephone handset of claim 1 wherein a position of the navigation and selection key is determined to allow the user to hold the phone in one hand and manipulate the navigation and selection key with the thumb of that hand.

8. The telephone handset of claim 1 wherein the navigation and selection key performs a swing movement around a hinge axis when depressed to activate a microswitch.

9. The telephone handset according to claim 1 wherein the roller body is adapted to have twelve positions per revolution, each position being mechanically defined.

10. A navigation key for providing control signals in dependence on the operation thereof, comprising:
    a roller body acting as a navigation key;
    a carrier for carrying said roller body, wherein the carrier comprises a shaft part retained between two plate-shaped end parts, said roller body is arranged rotatably on said shaft part, and said end parts are furthermore adjoined by at least one beam-shaped leg part extending along the shaft part for providing a stiff structure for the carrier;
    two leg parts in parallel with the shaft part, the hinge part of the carrier extending outwardly from one of said leg parts;
    a supporting means supporting said carrier;
    said carrier being hinged relative to the supporting means by cooperating hinging parts;
    biasing means for urging the carrier and the supporting means away from each other at a distance from said hinging parts; and
    detection means for detecting a force counteracting the biasing force provided by said biasing means and for providing a second control signal in dependence thereon.

11. A navigation key structure according to claim 10, wherein the roller body is shaped as a barrel having a through bore for pivotal reception of said shaft part.

12. A navigation key structure according to claim 10, wherein the roller body is provided with a cam-shaped disc member for cooperation with a spring member fixed to said shaft part, thereby defining a number of discrete positions allowable during the revolution of the roller body.

13. A navigation key structure according to claim 12, wherein the diameter of the through bore of the roller member expands at one end of the member for providing an internal chamber in the roller body containing said cam-shaped disc member and said spring member.

14. A navigation key structure according to claim 13, wherein said cam-shaped disc member is received in the through bore of the roller member and acts as end wall for said chamber, said disc member being provided with a central opening for the shaft part.

15. A navigation key structure according to claim 10, wherein the carrier furthermore carries an encoder means aligned with the roller body for detecting the rotation of said body and for providing a control signal in dependence thereon.

16. A navigation key structure according to claim 14, wherein the outer surface of the disc-shaped member is provided with a pattern readable by the encoder means.

17. A navigation key structure according to claim 16, wherein the outer surface of the disc-shaped member is provided with a pattern which is readable by the encoder means.

18. A telephone handset having a front surface with a display and a keypad, wherein said keypad includes a group of keys for data entry and a key for navigating a cursor in the display and selecting an item in dependence of the position of the cursor;
    said navigation and selection key positioned in the front surface of the phone between the display and the group of data entry keys;
    said navigation and selection key includes a roller body which is essentially cylindrical with a length and diameter of substantially the same size as the width of the keys in said group of keys for entering alphanumeric signs, and extends partly through an opening in the front surface of the phone, and has an axis of rotation perpendicular to the longitudinal axis of the phone;
    said roller body is fully rotatable and is allowed to adopt a predetermined number of valid positions during a rotation for moving the cursor, and can be depressed to request performance of an action in dependence of the position of the cursor; and
    wherein the navigation and selection key performs a swing movement around a hinge axis when depressed to activate a microswitch.

* * * * *